United States Patent
Oberhuber et al.

(10) Patent No.: US 6,982,627 B2
(45) Date of Patent: Jan. 3, 2006

(54) LOW POWER REGULATED AMPLIFIER FOR A TRANSPONDER

(75) Inventors: Ralph Oberhuber, Kumhausen/Landshut (DE); Wolfgang Steinhagen, Mauern (DE); Franz Prexl, Niederding (DE)

(73) Assignee: Texas Instruments Incorporated, Dallas, TX (US)

( * ) Notice: Subject to any disclaimer, the term of this patent is extended or adjusted under 35 U.S.C. 154(b) by 155 days.

(21) Appl. No.: 10/460,824

(22) Filed: Jun. 13, 2003

(65) Prior Publication Data

US 2004/0135673 A1    Jul. 15, 2004

(30) Foreign Application Priority Data

Jul. 1, 2002    (DE)    ................................ 102 29 459

(51) Int. Cl.
*H04Q 5/22* (2006.01)
*H04B 1/16* (2006.01)
*H03C 1/52* (2006.01)

(52) U.S. Cl. ............... 340/10.1; 340/10.52; 455/245.1; 455/248; 455/106

(58) Field of Classification Search ............... 340/10.1, 340/10.52; 455/245.1, 240.1, 247.1, 248, 455/307, 106, 107, 260; 330/75
See application file for complete search history.

(56) References Cited

U.S. PATENT DOCUMENTS

| | | | |
|---|---|---|---|
| 4,123,718 A * | 10/1978 | Lampert et al. | ............. 375/345 |
| 4,817,198 A * | 3/1989 | Rinderle | ................... 455/249.1 |
| 4,933,647 A | 6/1990 | Dea et al. | |
| 5,331,638 A * | 7/1994 | Honkasalo et al. | ......... 370/347 |
| 5,361,395 A * | 11/1994 | Yamamoto | ................... 455/436 |
| 5,537,672 A * | 7/1996 | Grabow et al. | ............. 455/132 |
| 5,548,594 A * | 8/1996 | Nakamura | ................... 370/347 |
| 5,699,017 A | 12/1997 | Maejima | |
| 5,936,462 A * | 8/1999 | Muraishi | ..................... 329/311 |
| 6,311,047 B1 * | 10/2001 | Gotou | ...................... 455/234.1 |
| 6,683,925 B1 * | 1/2004 | Katsura et al. | ............. 375/345 |
| 6,812,824 B1 * | 11/2004 | Goldinger et al. | ......... 340/10.1 |
| 2001/0028302 A1 * | 10/2001 | Degrauwe et al. | ......... 340/10.5 |

FOREIGN PATENT DOCUMENTS

| | | |
|---|---|---|
| EP | 0 722 094 A1 | 7/1996 |
| JP | 57192115 | 11/1982 |

* cited by examiner

*Primary Examiner*—Michael Horabik
*Assistant Examiner*—Nam Nguyen
(74) *Attorney, Agent, or Firm*—J. Dennis Moore; W. James Brady, III; Frederick J. Telecky, Jr.

(57) ABSTRACT

A transponder (1) comprising an antenna (4), a demodulator (5) and a signal processing circuit (6) which converts a modulated signal received via the antenna (4) into a signal suitable for processing in the demodulator (5). The signal processing circuit (6) comprises an amplifier (7) with a predefined amplification factor and a closed loop control circuit (8) serving to maintain the voltage swing of the processed signal applied at the input of the demodulator (5) substantially constant. In a preferred embodiment the closed loop control circuit comprises a capacitor which is continually discharged and differingly charged as a function of the strength of the output signal of the amplifier of the signal processing circuit, the voltage resulting across the capacitor controlling a controllable resistor connected in parallel to the input of the signal processing circuit and forming with a coupling capacitor a voltage divider.

11 Claims, 2 Drawing Sheets

US 6,982,627 B2

LOW POWER REGULATED AMPLIFIER FOR A TRANSPONDER

FIELD OF THE INVENTION

The invention generally relates to a low power regulated amplifier. More specifically, the invention relates to an amplifier in a transponder comprising an antenna, a demodulator for demodulating a received signal and a signal processing circuit which converts a modulated signal received via the antenna into a signal suitable for processing in the demodulator.

BACKGROUND OF THE INVENTION

There are many common uses of transponders and readers as a means of identification. For instance, transponders are incorporated in car keys in conjunction with readers located in the vehicle to form a passive cryptologically safeguarded vehicle access system.

As a rule, the transponder contains a demodulator to permit demodulation of the signals received by the reader. The input of the demodulator is, as a rule, a signal processing circuit making the connection between the antenna of the transponder and the demodulator and converting the signal received at the antenna of the transponder into a form suitable for the demodulator.

One problem associated with transponders is that the input signal received by the reader exhibits very large fluctuations as regards its voltage level. For instance, amplitude shift keyed (ASK) signals may feature a peak-to-peak voltage level between 5 mV and 15 V. The reason for this heavy fluctuation in the voltage level is that the distance between the reader sending the signal and the transponder greatly differs. This is due to the fact that in the case of a passive vehicle access system the driver holding the key incorporating the transponder is at a distance away from the vehicle which greatly differs when he actuates the key.

SUMMARY OF THE INVENTION

The present invention solves the above problem and provides an improved transponder having a special signal processing circuit.

In accordance with the invention the signal processing circuit of the transponder comprises an amplifier with a predefined amplification factor and a closed loop control circuit serving to maintain the voltage swing of the processed signal applied at the input of the demodulator substantially constant.

It is this configuration of the transponder and of the signal processing circuit that now permits the use of demodulators which are particularly simple for precise operation since the level of the input signal of the demodulator is maintained constant and is now independent of the distance between the transponder and reader.

Advantageous further embodiments of the invention are characterized in the sub-claims.

BRIEF DESCRIPTION OF THE DRAWINGS

The invention will now be detailed by way of example with reference to the drawing in which.

DETAILED DESCRIPTION OF THE PREFERRED EMBODIMENTS

Figure 1:
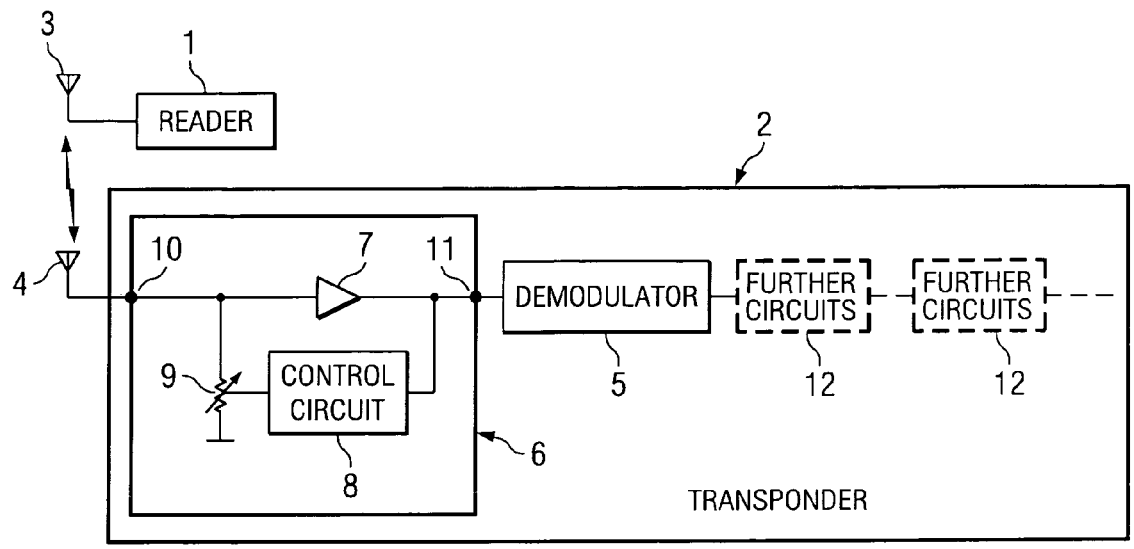
FIG. 1 is a block diagram of a contactless data communication system including a transponder in accordance with the invention.

Referring now to FIG. 1 there is illustrated a contactless data communication system comprising a reader 1 and a transponder 2. The data communication system may be e.g. a passive RFID system as used in vehicle access systems.

Via the antenna 3 connected to it, the reader is able to send signals to the transponder 2 which are received via the antenna 4 of the transponder 2.

The signals emitted by the reader in this arrangement are preferably amplitude-keyed (ASK modulation) in which the amplitude of a carrier oscillation is switched between two states by a binary coded signal.

The transponder 2 contains a demodulator 5 serving to demodulate the ASK signals so that they can be processed and analyzed in further circuit assemblies 12 in the transponder. Connected between the antenna 4 and the demodulator 5 is a signal processing circuit 6. The signal processing circuit 6 includes an amplifier 7, preferably an operational amplifier, having a fixed predetermined amplification factor. The amplification factor may be e.g. 500. Connected to the output of the amplifier 7 is a closed loop control circuit 8 which receives the signal output by the amplifier and converts it into a signal proportional to the strength of the output signal for controlling a resistor 9 connected in parallel to the input 10 of the signal processing circuit 6.

Due to the distance between the reader 1 and transponder 2 not being constant the strength of the signal received at the input 10 of the transponder likewise greatly fluctuates. In the selected example embodiment the peak-to peak voltage of the input signal may vary between 5 mV and 15 V. The signal processing circuit 6 then converts the signal received at the input 10 into a signal at its output 11 whose maximum level is substantially constant so that it can now be processed by the demodulator 5 by particularly simple ways and means.

When e.g. the reader 1 approaches the transponder 2 in thus increasing the maximum peak-to-peak voltage of the ASK signal received at the input 10 of the transponder 2, then a signal having a higher level appears at the output of the amplifier 7 and thus at the input of the closed loop control circuit 8. This signal prompts the closed loop control circuit to regulate the controllable resistor 9 smaller so that thereafter only a smaller proportion of the input signal applied to the input 10 gains access to the input of the amplifier 7. In this arrangement the proportion of the input signal dropped across the controllable resistor 9 is set in each case so that the voltage materializing at the output 11 of the signal processing circuit 6 remains more or less constant as regards its peak-to-peak swing. This enables a demodulator of simple configuration to be used at the output 11 of the signal processing circuit for demodulating the signal.

Figure 2:
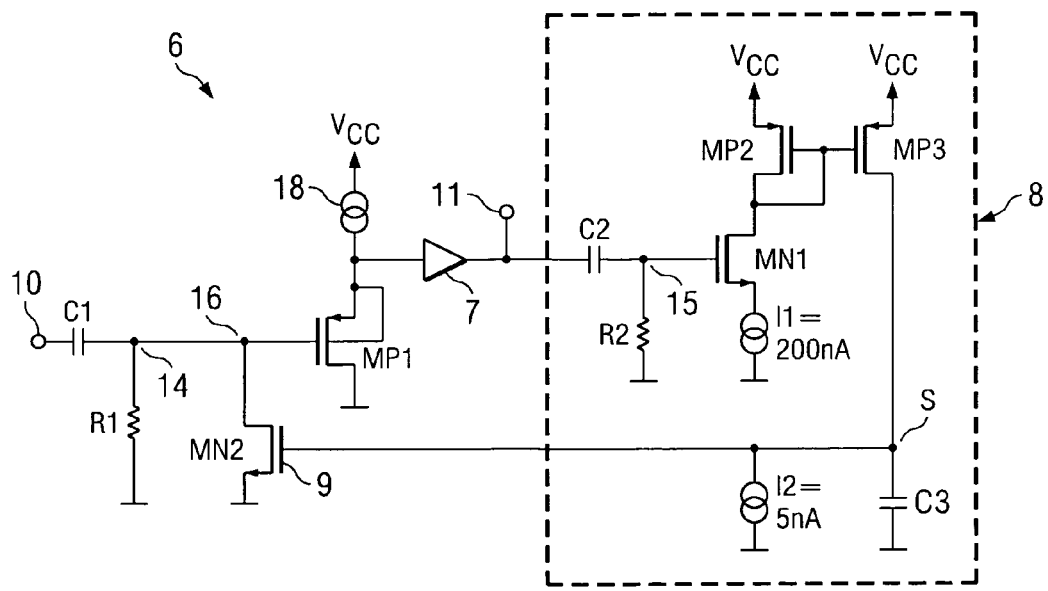
FIG. 2 is a circuit diagram of a preferred embodiment of the signal processing circuit of a transponder in accordance with the invention.

Referring now to FIG. 2 there is illustrated a further embodiment of a signal processing circuit 6.

The input 10 of the signal processing circuit 6 is connected to the antenna of the transponder 2. Via the coupling capacitor C1 the antenna voltage is coupled into the circuit (AC coupling). The pulldown resistor R1 connected between coupling capacitor C1 and ground references the signal at the node 14 to ground. The current source 18 serves together with the p-channel MOSFET MP1 as a potential shifter to attain a suitable bias as the input voltage for the amplifier 7 whose input is connected to the source of the p-channel MOSFET MP1. Available at the output of the amplifier 7 is the output signal of the signal processing circuit 6 which is then relayed e.g, to an ASK demodulator. The output of the signal processing circuit is identified in FIG. 2 by reference numeral 11.

A fluctuation in the distance between the reader 1 and the transponder 2 when ASK signals are sent from the reader to the transponder may result in the input signal of the transponder greatly varying as regards its voltage level. For instance voltage levels of between 5 mV and 15 V peak-to-peak voltage may occur.

So that the demodulator connected to the output 11 of the signal processing circuit 6 is shielded from these voltage fluctuations a closed loop control circuit 8 is provided which together with the controllable resistor 9 ensures that the signal applied to the output 11 of the demodulator remains substantially constant in thus enabling e.g. a constant maximum peak-to-peak voltage of 1 V to be achieved at the demodulator input.

The closed loop control circuit 8 comprises firstly a coupling capacitor C2 connected to the output of the amplifier 7 and to a pulldown resistor R2.

The circuit point 15 between the coupling capacitor C2 and pulldown resistor R2 is connected to the gate of an n-channel MOSFET MN1. The source-drain circuit of the n-channel MOSFET MN1 is connected to a first current source 11 furnishing a current of e.g. 200 nA and, in addition, to the first branch of a current mirror made up of two p-channel MOSFETs MP2, MP3.

The branch of the current mirror formed by the MOSFET MP3 is connected to a capacitor C3. The capacitor C3 is, in addition, connected to a second current source 12 furnishing a smaller current than the first current source. The current of the second current source 12 may be around e.g. 5 nA. In addition, the capacitor C3 is connected to the gate of an n-channel MOSFET MN2 forming the controllable resistor 9. The source-drain circuit of the n-channel MOSFET MN2 is connected to the capacitor C1 and gate of the p-channel MOSFET MP1. The ON resistor of the MOSFET MN2 forms together with the coupling capacitor C1 a voltage divider.

The functioning of the signal processing circuit 6 as shown in FIG. 2 will now be described.

Assuming firstly that the distance between the reader and the transponder becomes smaller whilst the ASK signals are being sent to the transponder and that the signal materializing at the input 10 of the signal processing circuit has an increasing signal level, then when the voltage materializing at the output of the amplifier 7 increases beyond the threshold voltage of the MOSFET MN1 the current of current source 11 is mirrored by the current mirror comprising MP2 and MP3 and charges capacitor C3. At the same time, capacitor C3 is discharged by the current from current source 12 which is substantially smaller than the maximum current of current source I1. The voltage resulting at capacitor C3 (circuit point S) thus represents a balanced status resulting from the momentary ratio of the currents I1 and I2.

An increase in the level of the signal applied to the input 10 of signal processing circuit 6 then causes MOSFET MN1 to open up stronger and coupling capacitor C2 receiving a stronger charge. The voltage across the capacitor C3 is a measure of the maximum amplitude of the input signal existing at the time. When the voltage across the capacitor C3 then increases, the ON resistance of MOSFET MN2 is reduced so that the voltage dropper ratio C1/MN2 is changed to thus reduce the voltage swing of the input signal materializing at circuit point 16 of the signal processing circuit 6. Since the amplification factor of the amplifier 7 is fixed, the amplitude of the signal occurring at the output 11 of the signal processing circuit is also reduced. This enables a signal having a substantially constant maximum voltage swing being made available at output 11 which can be processed by simple ways and means in a subsequent demodulator.

An increase in the distance between the reader and transponder reduces the maximum voltage swing of the ASK input signal of the transponder received via the antenna 4 until, at some time, the voltage applied to the gate of the MOSFET MN1 becomes smaller than its threshold voltage so that the current flowing through the current mirror transistor MP3 disappears and the capacitor is discharged only by the small current 12. This reduces the voltage at the gate of MOSFET MN2 resulting in the ON resistance of MN2 being increased, as a result of which the voltage applied to the circuit point 16 is increased due to the voltage divider function of C1 and MN2 which in turn produces a higher level at the input of the amplifier 7 and a larger output amplitude at output 11 of the amplifier.

The closed loop control circuit 8 forces the average amplitude of the output voltage as applied to the output 11 of the signal processing circuit 6 to a value corresponding to the threshold voltage of MOSFET MN1, i.e. approximately 0.6 V. The time constant defined by the small discharge current 12 can be set so that an ASK input signal is directed to the output 11 with a defined time constant with minimum loss.

Figure 3:
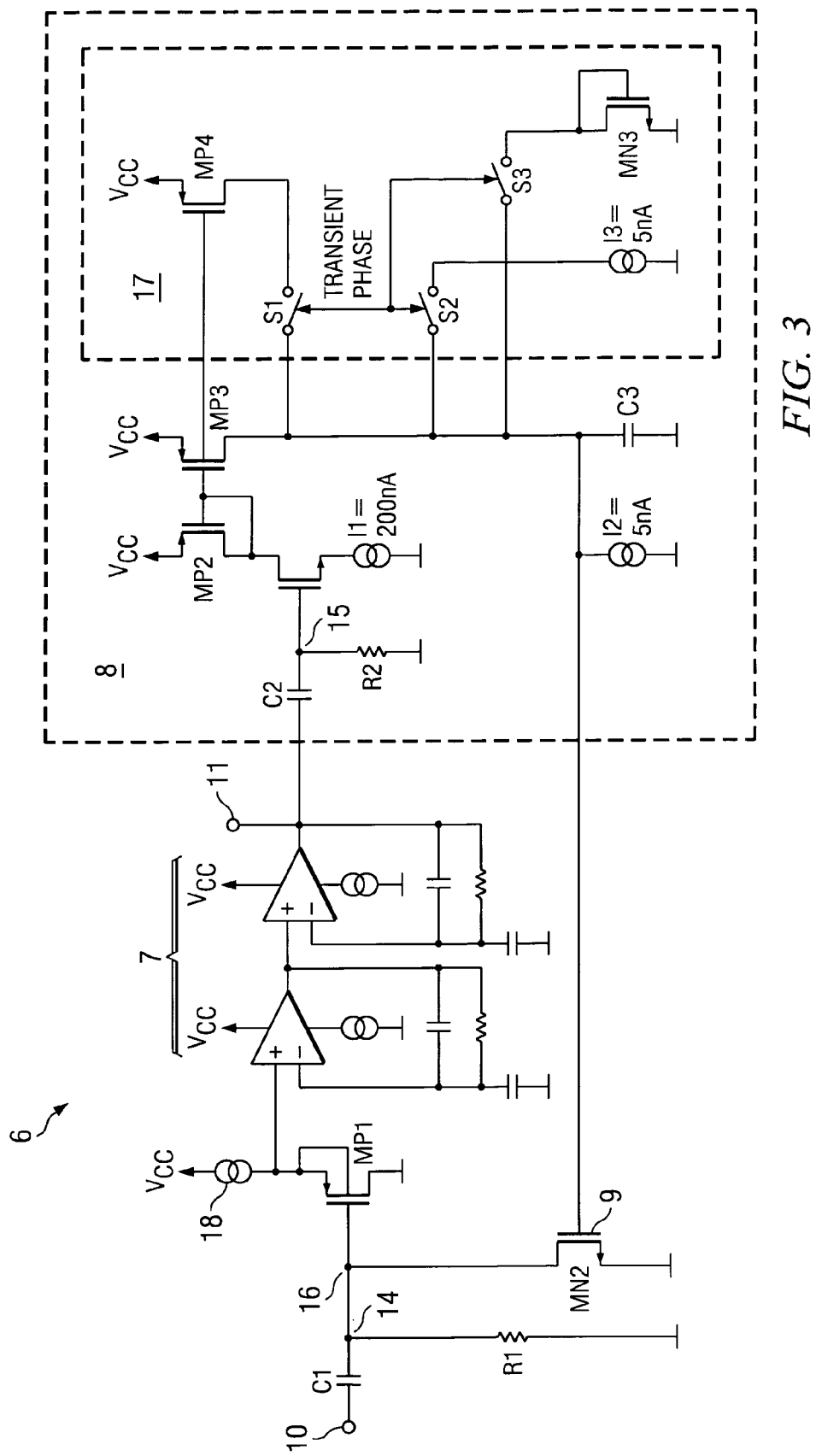
FIG. 3 is a circuit diagram of a further embodiment of the signal processing circuit of the transponder in accordance with the invention.

Referring now to FIG. 3 there is illustrated a further embodiment of the signal processing circuit 6 in accordance with the invention.

The signal processing circuit as shown in FIG. 3 differs in two items from the embodiment as shown in FIG. 2. Like elements in FIGS. 2 and 3 are identified by like reference numerals.

For one thing, it is shown how a concrete solution for the amplifier 7 can be visualized which in FIG. 3 comprises two amplifier stages in sequence, each of which may comprise NMOS differential amplifiers with negative feedback.

For another, a circuit 17 is provided which permits fast circuit initialization.

The circuit 17 comprises a p-channel MOSFET MP4 connected in parallel to the second p-channel MOSFET MP2. The gate of the MOSFET MP4 is connected to the gate of MOSFET MP3. In the transient phase of the closed loop control circuit 8, the MOSFET MP4 is connected in parallel to MOSFET MP3 by a first switch SI so that the capacitor C3 can be charged with twice the current. In addition, a second discharge current source 13 is provided which furnishes the same current as current source 12 and which is activated in the transient phase via switch S2 to thus result in twice the discharging current also flowing in the transient phase. In conclusion, a further n-channel MOSFET MN3 is provided which functions as a clamping diode and which can be connected to the capacitor C3 via the switch S3 in the transient phase. Thus, in the transient phase switches S1, S2, S3 are closed speeding up the transient response of the circuit. The clamping diode MN3 restricting the voltage across the capacitor C3 prevents spiking. After a predefined time period of having turned on the closed loop control the transient phase is turned off by switches S1, S2, S3 being opened.

What is claimed is:

1. A transponder comprising:
   an antenna;
   a demodulator;
   a signal processing circuit having an output connected to an input of said demodulator and which converts a modulated signal received via said antenna into a processed signal applied at the input of said demodulator and suitable for further processing in said demodulator; and
   an amplifier with a predefined amplification factor and a closed loop control circuit serving to maintain the peak-to-peak voltage swing of the processed signal applied at the input of said demodulator substantially constant.

2. The transponder as set forth in claim 1 wherein said closed loop control circuit is configured so that it senses an output signal of said amplifier of said signal processing circuit appearing at the input of said demodulator and controls a controllable resistor, connected in parallel to said input of said signal processing circuit and upstream of the input of said amplifier, as a function of the strength of said output signal.

3. The transponder as set forth in claim 2 wherein said closed loop control circuit comprises a capacitor which is continually discharged and, alternatively, charged as a function of the strength of said output signal of said amplifier of said signal processing circuit, the balance between charging current and discharging current determining the voltage across said capacitor which in turn controls said controllable resistor.

4. The transponder as set forth in claim 3 wherein said closed loop control circuit comprises a first current source for charging said capacitor and a second current source for discharging said capacitor, the current of said first current source being larger than the current of said second current source.

5. The transponder as set forth in claim 4 wherein said closed loop control circuit comprises a further discharging current source, a further charging current source, and one or more switches via which said further current sources can be activated for a certain time period during initialization of said closed loop control circuit to reduce the transient delay of said closed loop control circuit.

6. The transponder as set forth in claim 5 wherein said closed loop control circuit comprises further a clamping diode and a further switch for connecting said clamping diode to said capacitor during initialization of said closed loop control circuit.

7. The transponder as set forth in claim 6 wherein said controllable resistor consists of a MOSFET.

8. The transponder as set forth in claim 1 wherein said demodulator is an ASK demodulator.

9. The transponder as set forth in claim 2 wherein said demodulator is an ASK demodulator.

10. The transponder as set forth in claim 1 wherein the transponder is part of a passive RFID data communication system.

11. The transponder as set forth in claim 2 wherein the transponder is part of a passive REID data communication system.

* * * * *